United States Patent
Kim et al.

(10) Patent No.: US 9,459,522 B2
(45) Date of Patent: Oct. 4, 2016

(54) EXPOSURE MASK AND METHOD OF FABRICATING DISPLAY PANEL USING THE SAME

(71) Applicant: Samsung Display Co., Ltd., Yongin, Gyeonggi-Do (KR)

(72) Inventors: Jungi Kim, Guri-si (KR); Taegyun Kim, Yongin-si (KR); Jin-Su Byun, Seongnam-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 128 days.

(21) Appl. No.: 14/226,558

(22) Filed: Mar. 26, 2014

(65) Prior Publication Data

US 2015/0093687 A1    Apr. 2, 2015

(30) Foreign Application Priority Data

Oct. 1, 2013 (KR) .................. 10-2013-0117470

(51) Int. Cl.
*G03F 7/20* (2006.01)
*G03F 1/38* (2012.01)
*G03F 1/00* (2012.01)
*G03F 7/00* (2006.01)

(52) U.S. Cl.
CPC .............. *G03F 1/00* (2013.01); *G03F 7/0007* (2013.01); *G03F 7/20* (2013.01)

(58) Field of Classification Search
CPC .............. G03F 1/00; G03F 1/38; G03F 7/20
USPC .............................. 430/5, 319, 314, 321, 315
See application file for complete search history.

(56) References Cited

U.S. PATENT DOCUMENTS

| | | | |
|---|---|---|---|
| 2005/0142680 A1* | 6/2005 | Ha | G02F 1/136227 438/30 |
| 2006/0240604 A1 | 10/2006 | Yamaguchi et al. | |
| 2012/0145668 A1* | 6/2012 | Riege | G03F 1/38 216/41 |
| 2012/0280237 A1 | 11/2012 | Kwack et al. | |
| 2013/0087794 A1 | 4/2013 | Kwack | |

FOREIGN PATENT DOCUMENTS

| | | | |
|---|---|---|---|
| JP | 2004-294805 A | * | 10/2004 |
| KR | 1020060113118 A | | 11/2006 |
| KR | 1020070045751 A | | 5/2007 |
| KR | 1020080011558 A | | 2/2008 |
| KR | 1020080041018 A | | 5/2008 |
| KR | 1020110066807 A | | 6/2011 |

(Continued)

OTHER PUBLICATIONS

Computer-generated translation of JP 2004-294805 (Oct. 2004).*
Computer-generated translation of KR 10 2006 0113118 (Nov. 2006).*

(Continued)

*Primary Examiner* — John A McPherson
(74) *Attorney, Agent, or Firm* — Cantor Colburn LLP

(57) ABSTRACT

An exposure mask for forming a pattern in a photosensitive material includes a mask substrate which is disposed facing the photosensitive material; a body portion on the mask substrate and corresponding to a shape of the pattern at a distance furthest from the exposure mask; and a plurality of branch portions on the mask substrate and each extending outward from an outer edge of the body portion, in a plan view. The pattern comprises a contact hole of a display device.

20 Claims, 8 Drawing Sheets

(56) References Cited

FOREIGN PATENT DOCUMENTS

KR   1020110070591 A   6/2011
KR   1020120066517 A   6/2012

OTHER PUBLICATIONS

Partial computer-generated translation of KR 10 2011 0066807 (Jun. 2011).*

* cited by examiner

EXPOSURE MASK AND METHOD OF FABRICATING DISPLAY PANEL USING THE SAME

This application claims priority to Korean Patent Application No. 10-2013-0117470, filed on Oct. 1, 2013, and all the benefits accruing therefrom under 35 U.S.C. §119, the entire contents of which are hereby incorporated by reference.

BACKGROUND (1) Field

Exemplary embodiments of the invention relate to an exposure mask and a method of fabricating a display panel using the same, and in particular, to an exposure mask for reducing a contact failure between layers connected through a contact hole and a method of fabricating a display panel using the same.

(2) Description of the Related Art

In a photo-lithography process, an exposure mask with optically opaque and transparent regions is used to form patterns having the same shape as that of the opaque or transparent region, on a target layer. The opaque and transparent regions can be realized using the presence or absence of mask patterns.

To be more concrete, if a photoresist layer provided on the target layer is illuminated using the exposure mask, selectively exposing some regions of the photoresist layer corresponding to the mask patterns is possible. In a subsequent development step of the photo-lithography process, the exposed or unexposed region of the photoresist layer is removed to form photoresist patterns. In a subsequent etching step of the photo-lithography process, some regions of the target layer exposed by the photoresist patterns are etched or removed. As a result, a desired pattern can be formed in the target layer.

SUMMARY

Exemplary embodiments of the invention provide an exposure mask capable of reducing or preventing a contact failure between layers connected through a contact hole formed by using the exposure mask, and a method of fabricating a display panel using the same.

According to exemplary embodiments of the invention, an exposure mask for forming a pattern in a photosensitive material includes: a mask substrate which is disposed facing the photosensitive material; a body portion on the mask substrate and corresponding to a shape of the pattern at a distance furthest from the exposure mask; and a plurality of branch portions on the mask substrate and each extending outward from an outer edge of the body portion, in a plan view. The pattern comprises a contact hole of a display device.

In exemplary embodiments, the body portion may have a polygon shape including a plurality of sides, in the plan view, a branch portion among the plurality of branch portions may extend from each side of the body portion, and the branch portion may extend perpendicular to the side from which it extends, in the plan view.

In exemplary embodiments, adjacent branch portions may be spaced apart from each other at a pitch from about 1 micrometer to about 2.6 micrometers.

In exemplary embodiments, a width of each branch portion may be from about 30% to about 60% of the pitch.

In exemplary embodiments, each branch portion may be elongated from the outer edge of the body portion, and may have a length from about 1 micrometer to about 5 micrometers.

In exemplary embodiments, a width of each branch portion may decrease as a distance from the body portion increases, in the plan view.

In exemplary embodiments, the photosensitive material is a negative photosensitive material.

In exemplary embodiments, the body portion and the plurality of branch portions may include a light-blocking material.

In exemplary embodiments, an underlying structure may include first insulating layer each including the photosensitive material in which the pattern is formed; a metal layer under the first insulating layer; and the second insulating layer between the first insulating layer and the metal layer. The contact hole may expose the metal layer through the second insulating layer.

In exemplary embodiments, the first insulating layer may further include an organic insulating material, and the second insulating layer may further include an inorganic insulating material.

According to exemplary embodiments of the invention, a method of fabricating a display panel includes providing a base substrate, providing a metal layer on the base substrate; providing a first insulating layer including a photosensitive material, on the metal layer; disposing an exposure mask facing the first insulating layer, and exposing the first insulating layer using the exposure mask; developing the exposed first insulating layer to form a contact hole exposing a portion of the metal layer; and forming a transparent conductive layer on the exposed and developed first insulating layer, and electrically connected to the exposed portion of the metal layer via the contact hole. The exposure mask includes: a mask substrate; a body portion on the mask substrate which defines a shape of the contact hole at a distance furthest from the exposure mask; and a plurality of branch portions on the mask substrate and each extending outward from an outer edge of the body portion, in a plan view.

In exemplary embodiments, the body portion may have a polygonal shape including a plurality of sides, in the plan view, a branch portion among the plurality of branch portions extends from each side of the body portion, and the branch portion extends perpendicular to the side from which it extends, in the plan view.

In exemplary embodiments, adjacent branch portions may be spaced apart from each other at a pitch from about 1 micrometer to about 2.6 micrometers.

In exemplary embodiments, a width of the branch portion may be from about 30% to about 60% of the pitch.

In exemplary embodiments, each branch portion may be elongated from the outer edge of the body portion, and may have a length from about 1 micrometer to about 5 micrometers.

In exemplary embodiments, a width of each branch portion may decrease as a distance from the body portion increases.

In exemplary embodiments, the first insulating layer may include a negative photosensitive material.

In exemplary embodiments, the body portion and the plurality of branch portions may include a light-blocking material.

In exemplary embodiments, the method may further include providing a second insulating layer between the first insulating layer and the metal layer; and removing a portion of the second insulating layer to form the contact hole exposing the portion of the metal layer.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

Figure 1:
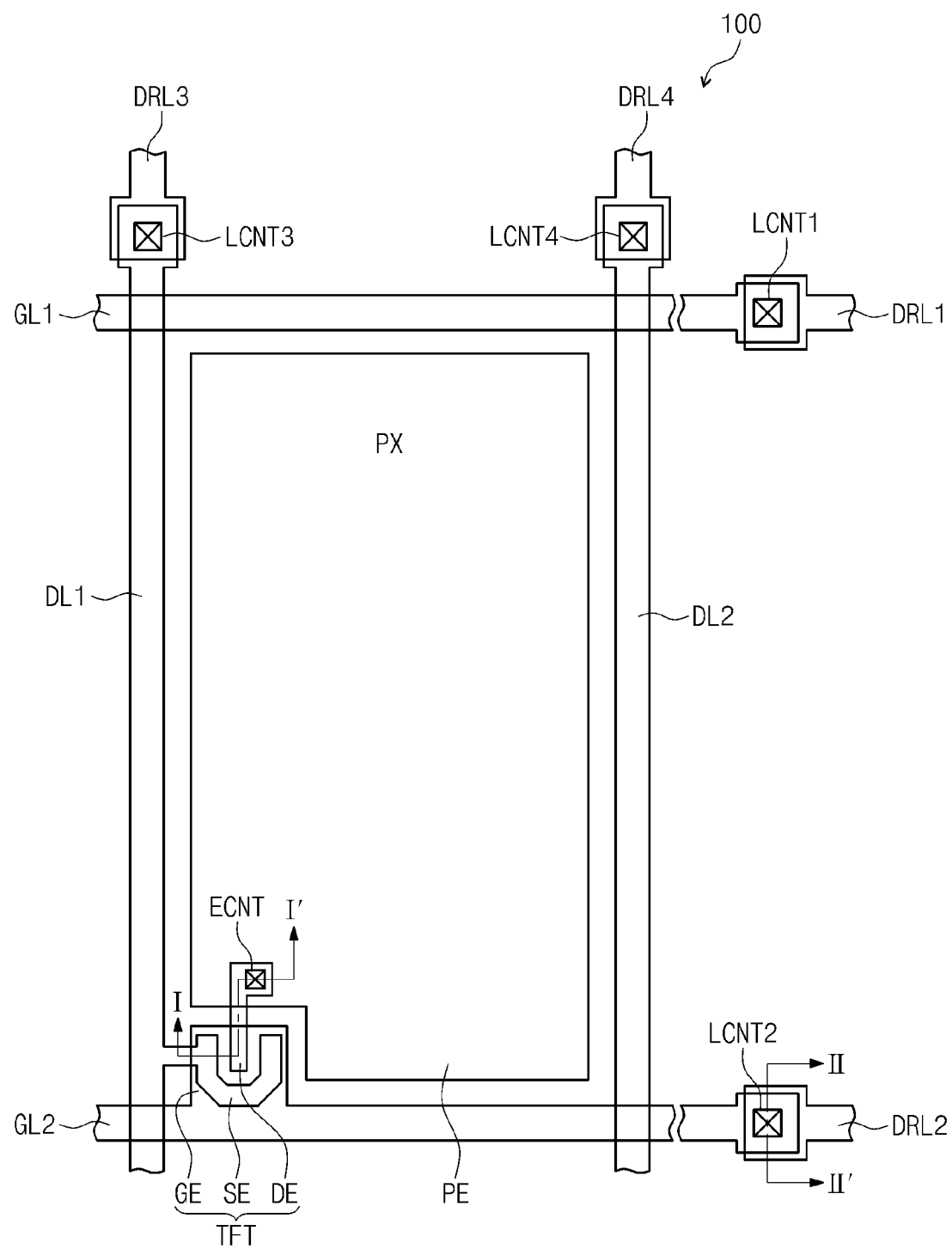
FIG. 1 is a plan view of an exemplary embodiment of a display panel, according to the invention.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary embodiments of the invention will now be described more fully with reference to the accompanying drawings, in which exemplary embodiments are shown. Exemplary embodiments of the invention may, however, be embodied in many different forms and should not be construed as being limited to the exemplary embodiments set forth herein; rather, these exemplary embodiments are provided so that this disclosure will be thorough and complete, and will fully convey the exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, connected may refer to elements being physically and/or electrically connected to each other. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "below," "above," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which exemplary embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. 1 is a plan view of an exemplary embodiment of a display panel, according to the invention.

Referring to FIG. 1, a display panel 100 may include a thin film transistor TFT, a pixel electrode PE, a plurality of gate lines GL1-GL2, a plurality of data lines DL1-DL2, and first to fourth pad electrodes DRL1-DRL4.

The display panel 100 may display an image in a display area thereof. The display panel 100 may include one of various display panels, such as an organic light emitting display panel, a liquid crystal display panel, a plasma display panel, an electrophoresis display panel and an electrowetting display panel, but the invention is not be limited thereto.

The display panel 100 may include a plurality of pixels PX, which may be disposed in a matrix arrangement and be connected to a plurality of signal lines. The pixels PX may be configured to have the same structure and function, and thus, one of the pixels PX is illustrated in FIG. 1, for the sake of brevity.

The signal lines may include the plurality of gate lines GL1-GL2 which transmits gate signals and the plurality of data lines DL1-DL2 which transmit data voltages. The gate lines GL1-GL2 may extend parallel to a row direction and be arranged side-by-side along a column direction. The gate lines GL1-GL2 may be connected to a gate driver (not shown) to sequentially receive gate voltages. The data lines DL1-DL2 may extend parallel to the column direction and be arranged side-by-side along the row direction. The data lines DL1-DL2 may be connected to a data driver (not shown) to receive data voltages associated with image information of the image to be displayed. The gate lines GL1-GL2 and the data lines DL1-DL2 may be formed of or include, for example, at least one metallic material having low resistance.

Each of the pixels PX may be connected to a corresponding one (e.g., second gate line GL2) of the gate lines GL1-GL2 and a corresponding one (e.g., first data line DL1) of the data lines DL1-DLm to produce an image.

The thin film transistor TFT may include a gate electrode GE, a source electrode SE and a drain electrode DE and provide a data voltage to the pixel electrode PE in response to a gate voltage. The gate electrode GE may be connected to the second gate line GL2, the source electrode SE may be connected to the data line DL1, and the drain electrode DE may be connected to the pixel electrode PE. The gate electrode GE may be a portion diverging from the second gate line GL2, and the source electrode SE may be a portion diverging from the first data line DL1. The gate electrode GE, the source electrode SE and the drain electrode DE may be formed of or include, for example, at least one metallic material having low resistance.

Contact holes may be provided to connect vertically-stacked layers physically and/or electrically to each other. The contact holes may include an electrode contact hole ECNT and line contact holes LCNT. In an exemplary embodiment, for example, a contact hole may be provided to connect a metal or transparent conductive layer to another layer. The electrode contact hole ECNT may be disposed on the drain electrode DE and expose the drain electrode DE. The line contact holes LCNT may include line contact holes LCNT1-LCNT4, each of which may be disposed on an end portion of a corresponding one of the signal lines adjacent to the gate or data driver. In an exemplary embodiment, for example, the line contact holes LCNT1-LCNT4 may be disposed on the first to fourth pad electrodes DRL1-DRL4 provided on end portions of the gate lines GL1-GL2 or end portions of the data lines DL1-DL2, and expose the first to fourth pad electrodes DRL1-DRL4. The first to fourth pad electrodes DRL1-DRL4 are in a different layer than that of the gate lines GL1-GL2 and data lines DL1-DL2, respectively.

The pixel electrode PE may be electrically connected to the drain electrode DE via the electrode contact hole ECNT. The data voltage transmitted from the thin film transistor TFT may be applied to the pixel electrode PE to form an electric field for controlling an image of the pixel PX. The pixel electrode PE may be formed of or include, for example, a transparent conductive material (e.g., indium tin oxide ("ITO")).

The first to fourth pad electrodes DRL1-DRL4 may connect the data lines DL1-DL2 and the gate lines GL1-GL2 to the data driver and the gate driver, respectively, through the line contact holes LCNT1-LCNT4. In one exemplary embodiment, for example, the second pad electrode DRL2 may connect the second gate line GL2 to the gate driver through the second line contact hole LCNT2, and the third pad electrode DRL3 may connect the first data line DL1 to the data driver through the third line contact hole LCNT3. The first to fourth pad electrodes DRL1-DRL4 may be formed of or include, for example, a transparent conductive material (e.g., ITO), and be formed using the same process as that for forming the pixel electrode PE in an exemplary embodiment of a method of manufacturing a display panel.

Figure 2:
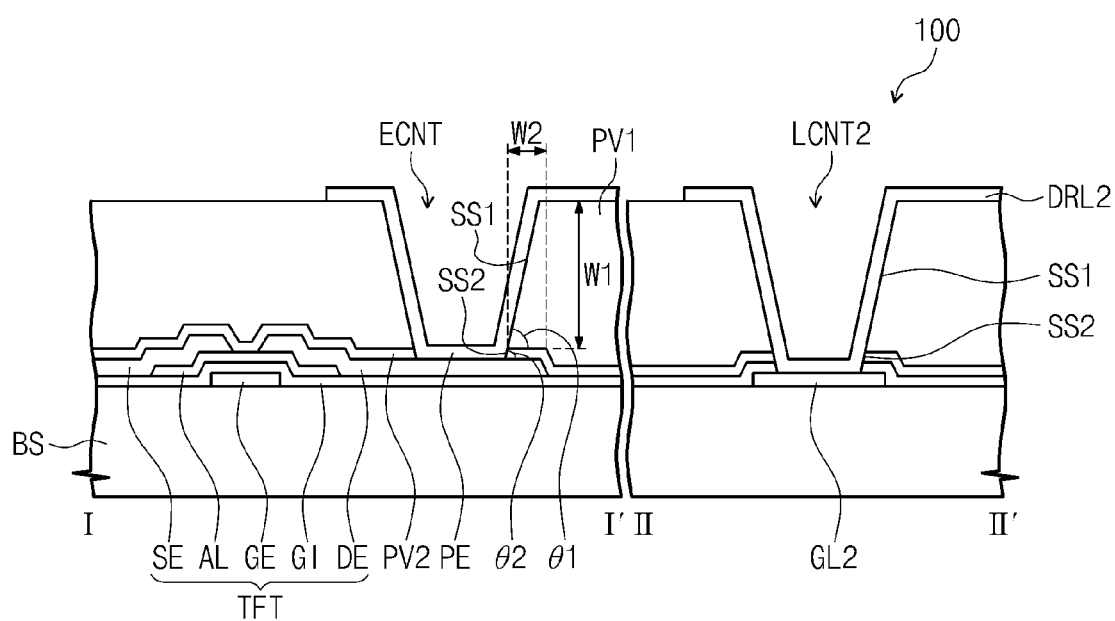
FIG. 2 is a cross-sectional view taken along lines I-I' and II-I' of FIG. 1.

FIG. 2 is a sectional view taken along lines I-I' and II-II' of FIG. 1.

Referring to FIG. 2, the display panel 100 may include a base substrate BS, the thin film transistor TFT, first and second insulating layers PV1 and PV2, the pixel electrode PE, the second gate line GL2 and the second pad electrode DRL2.

The thin film transistor TFT may include the gate electrode GE, the source electrode SE and the drain electrode DE, and provide the data voltage to the pixel electrode PE in response to the gate voltage.

The gate electrode GE may be disposed on the base substrate BS. A gate insulating layer GI may be provided on the gate electrode GE to cover the gate electrode GE. The gate insulating layer GI may include an organic layer and/or an inorganic layer.

A semiconductor layer AL may be provided on the gate electrode GE with the gate insulating layer GI interposed therebetween. The source electrode SE may diverge from the data line DL1 and be disposed on the gate electrode GE with the semiconductor layer AL interposed therebetween. The drain electrode DE may be disposed to be spatially and electrically spaced apart from the source electrode SE and be disposed on the gate electrode GE with the semiconductor layer AL interposed therebetween.

The second insulating layer PV2 may be disposed to cover the thin film transistor TFT. The second insulating layer PV2 may be formed of or include, for example, an inorganic insulating material.

The first insulating layer PV1 may be disposed to cover the second insulating layer PV2. In exemplary embodiments, the first insulating layer PV1 may be formed of or include a photo-sensitive organic matter. In one exemplary embodiment, for example, if light is incident into the first insulating layer PV1, a chemical property of a portion of the first insulating layer PV1 exposed to the light may be changed. As a chemical change, for example, the exposed and un-exposed portions of the first insulating layer PV1 may have a difference from each other in terms of solubility to developer.

In an exemplary embodiment where the first insulating layer PV1 is of a negative type, the unexposed portion of the first insulating layer PV1 may exhibit high solubility to the developer, while the exposed portion of the first insulating layer PV1 may exhibit no or low solubility to the developer.

Accordingly, if a developing step is performed on the first insulating layer PV1, patterns may be formed in the first insulating layer PV1 by the developing step. In one exemplary embodiment, for example, the unexposed portion of the first insulating layer PV1 may be dissolved and removed by the developer, while the exposed portion may not be removed and remain as the patterns.

In another exemplary embodiment, the first insulating layer PV1 may be of a positive type. Here, the unexposed portion of the first insulating layer PV1 may exhibit no or low solubility to the developer, while the exposed portion of the first insulating layer PV1 may exhibit high solubility to the developer.

If developing step is performed on the first insulating layer PV1, patterns may be formed in the first insulating layer PV1 by the developing step. In one exemplary embodiment, for example, the exposed portion of the first insulating layer PV1 may be dissolved and removed by the developer, while the unexposed portion may not be removed and remain as the patterns.

The contact hole may be defined through the first and second insulating layers PV1 and PV2, and even the gate insulating layer GI, to expose a layer disposed under the second insulating layer PV2 or the gate insulating layer GI. In exemplary embodiments, the contact hole defined through the first and second insulating layers PV1 and PV2 may include the electrode contact hole ECNT exposing the drain electrode DE and the second line contact hole LCNT2 exposing the gate line GL.

The contact hole ECNT may be defined extending through portions of the first and second insulating layer PV1 and PV2 to expose a portion of the drain electrode DE. Further, as the result of the formation of the contact hole ECNT, the first and second insulating layers PV1 and PV2 may have a first sloped surface SS1 and a second sloped surface SS2, respectively. In an exemplary embodiment, for example, the first and second sloped surfaces SS1 and SS2 may define the contact hole ECNT, along with the exposed portion under the second insulating layer PV2. The sloped surfaces SS1 and SS2 may be aligned with each other.

The contact hole LCNT2 may be defined extending through portions of the first and second insulating layer PV1 and PV2 and the gate insulating layer GI to expose a portion of the second gate line GL2. Further, as the result of the formation of the contact hole LCNT2, the first and second insulating layers PV1 and PV2 may have a first sloped surface SS1 and a second sloped surface SS2, respectively. The gate insulating layer GI may also have a sloped surface. In an exemplary embodiment, for example, the first and second sloped surfaces SS1 and SS2 and the sloped surface of the gate insulating layer GI may define each of the contact holes ECNT and LCNT2, along with the exposed portion under the gate insulating layer GI. The first and second sloped surfaces SS1 and SS2 and the sloped surface of the gate insulating layer GI may be aligned with each other.

As will be described below, the formation of the contact holes ECNT and LCNT2 may include exposing and developing the first insulating layer PV1, and then, etching the second insulating layer PV2.

The first sloped surface SS1 may be slanted at a first angle θ1 with respect to a top surface of the base substrate BS or a first direction. The first angle θ1 may be determined by a thickness W1 of the first insulating layer PV1 in a cross-sectional direction and a width W2 of the first sloped surface SS1 which may be measured in the first direction or projected on the top surface of the base substrate BS.

Similarly, the second sloped surface SS2 may be slanted at a second angle θ2 with respect to the top surface of the base substrate BS or the first direction. The second angle θ2 may be determined by a thickness (not labeled) of the second insulating layer PV2 and a width (not labeled) of the second sloped surface SS2 which may be measured in the first direction or projected on the top surface of the base substrate BS. Hereinafter, a term "undercut" will be used to refer to a profile of the first or second sloped surface SS1 or SS2, which forms an angle (e.g., θ1 or θ2) greater than 90°.

The pixel electrode PE may be provided on the first insulating layer PV1 and be electrically connected to the drain electrode DE. In one exemplary embodiment, for example, the pixel electrode PE may be disposed to cover a portion of a top surface of the first insulating layer PV1, the first and second sloped surfaces SS1 and SS2 and a portion of the drain electrode DE.

The second pad electrode DRL2 may be disposed to cover a portion of a top surface of the first insulating layer PV1, the first and second sloped surfaces SS1 and SS2 and a portion of the second gate line GL2.

Figure 3:
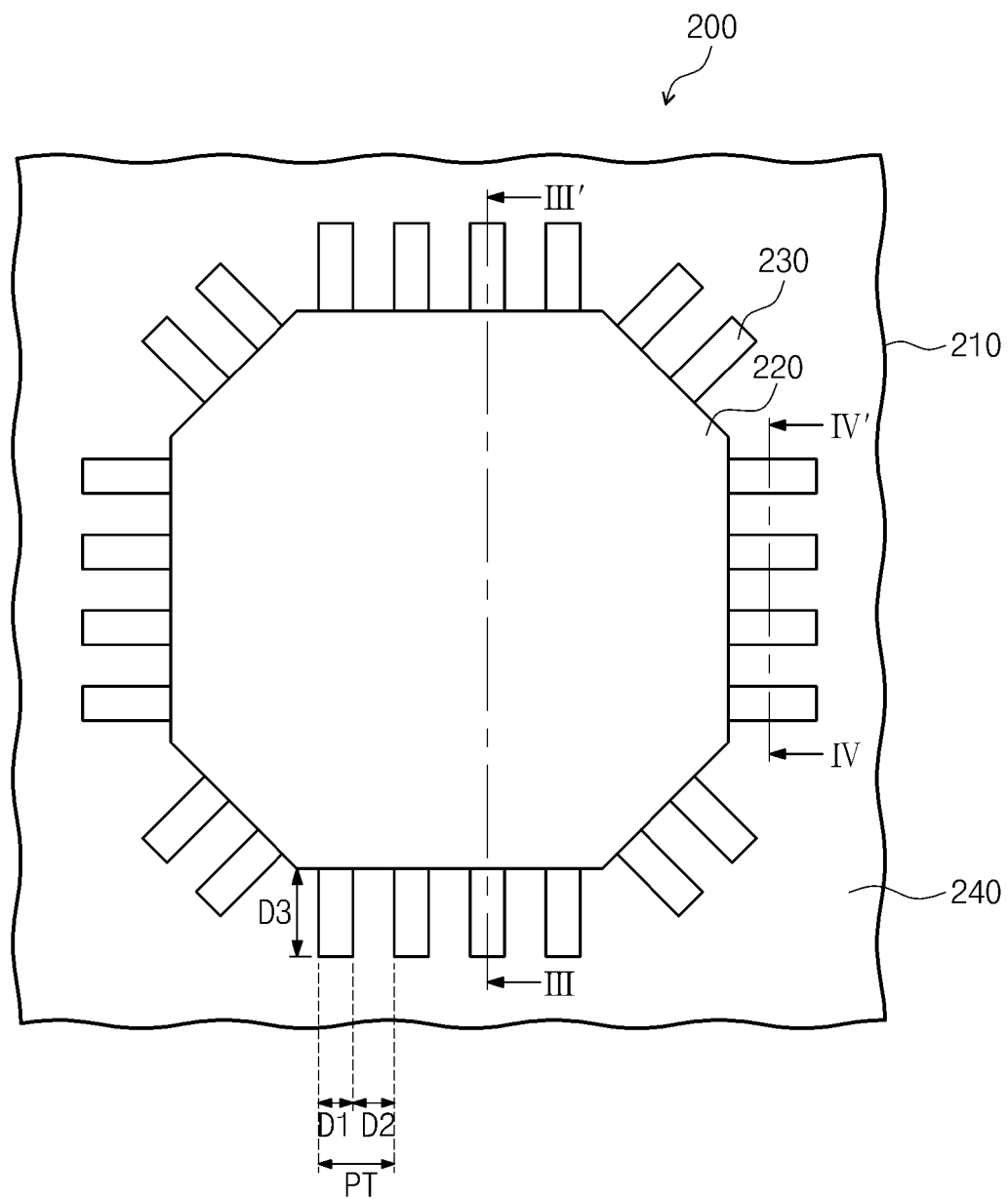
FIG. 3 is a plan view of an exemplary embodiment of an exposure mask according to the invention.

FIG. 3 is a plan view of an exemplary embodiment of an exposure mask according to the invention.

Referring to FIG. 3, an exposure mask 200 may include a mask substrate 210, a body portion 220 and a branch portion 230. An opening 240 may be defined outside the body portion 220 and the branch portion 230. Portions of the body portion 220 and the branch portion 230 may define the opening 240, but the invention is not limited thereto. In exemplary embodiments, the exposure mask 200 may be used to form a contact hole which exposes a metal layer. In one exemplary embodiment, for example, the exposure mask 200 may be used to expose an insulating layer. Here, the insulating layer may be the first insulating layer PV1 described with reference to FIG. 1 or FIG. 2.

The mask substrate 210 may be formed of or include a highly light-transmittable transparent material (e.g., quartz).

In one exemplary embodiment, for example, the mask substrate 210 may be configured to pass most of incident light therethrough.

The body portion 220 may be provided on the mask substrate 210. In exemplary embodiments, the body portion 220 may have a shape corresponding to a portion of the metal layer to be exposed by the formed contact hole. The portion of the metal layer exposed by the contact hole has a shape in the plan view. The shape of the exposed portion of the metal layer is at the bottom of the contact hole and may be considered as defining a bottom shape of the contact hole. The bottom of the contact hole is a position furthest away from the exposure mask 200. Therefore, the body portion 220 may define a bottom shape of the contact hole at the position further away from the exposure mask 200. In one exemplary embodiment, for example, the contact hole may be one of the electrode contact hole ECNT or the line contact holes LCNT1-LCNT4 of FIGS. 1 and 2, and the metal layer may be one of the drain electrode DE or the gate lines GL1-GL2 of FIGS. 1 and 2. The body portion 220 and/or the contact hole may be formed to have an octagonal shape in the plan view, but the invention is not limited thereto. In one exemplary embodiment, for example, the body portion 220 and/or the contact hole may have a polygonal or circular shape in the plan view.

The body portion 220 may be formed of or include a light-blocking material and thus prevent incident light from propagating therethrough. Where the body portion 220 includes a light-blocking material, the first insulating layer PV1 may be of a negative type. In another exemplary embodiment, the body portion 220 may be formed of or include a light-transmitting material to allow the incident light to propagate therethrough. Where the body portion 220 includes a light-transmitting material, the first insulating layer PV1 may be of a positive type.

A plurality of branch portions 230 may be provided on the mask substrate 210. In a plan view, the branch portions 230 may be arranged along an outer edge of the body portion 220 and each of the branch portions 230 may extend outward from the body portion 220. The branch portions 230 may be configured to allow a fraction or less than a whole of the light to propagate therethrough. Since the branch portions 230 may be configured to allow a fraction or less than a whole of the light to propagate therethrough, an amount of light to be incident into the first insulating layer PV1 may be adjusted.

As described above, a plurality of branch portions 230 may be arranged along the outer edge of the body portion 220. In one exemplary embodiment, for example, one or more branch portions 230 may extend from each side of the body portion 220 in a direction normal to the corresponding side of the body portion 220, in the plan view. The number of the branch portions 230 extending from each side may be variously changed, for example, in consideration of a length of each side.

On each side of the body portion 220, the branch portions 230 may be disposed spaced apart from each other by a specific space D2. A pitch PT of the branch portion 230 may be defined by adding a width D1 of the branch portion 230 and the space D2 between adjacent branch portions 230. In exemplary embodiments, the pitch PT may range from about 1 micrometer (μm) to about 2.6 μm. The width D1 of the branch portion 230 may range from about 30% to about 60% of the pitch PT. The width D1 of the branch portion 230 may be taken perpendicular to the direction normal to the corresponding side of the body portion 220. However, the invention is not limited to the above-described exemplified values of the pitch PT.

Each of the branch portions 230 may be shaped like a rectangle outwardly extending from a respective side of the body portion 220. An extending length D3 of the branch portion 230 may range from about 1 μm to about 5 μm. However, the invention is not limited the above-described exemplified shape of the branch portion 230.

Figure 4A:
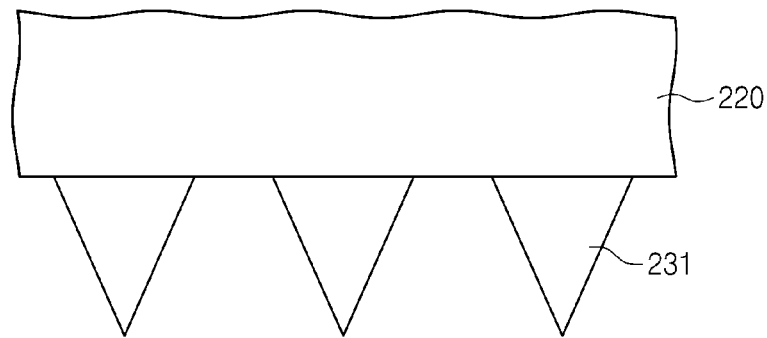
FIGS. 4A through 4C are enlarged plan views respectively illustrating exemplary embodiments of branch portions of an exposure mask according to the invention.
Figure 4B:
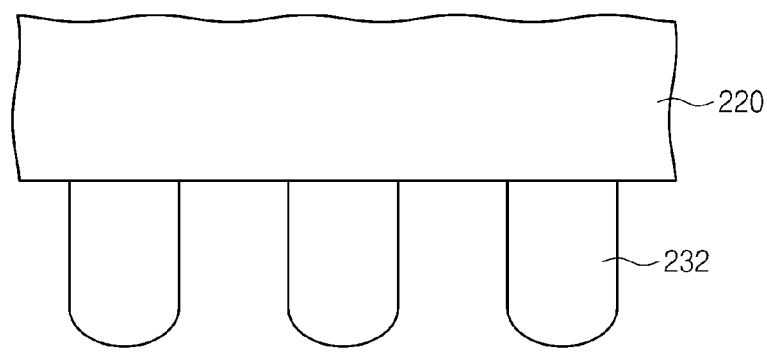
Figure 4C:
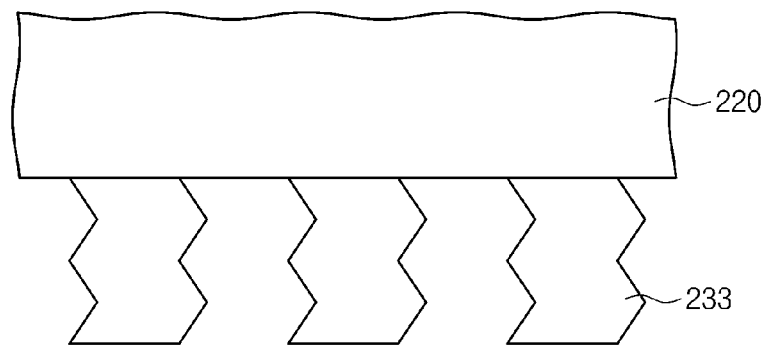

In an alternative exemplary embodiment, for example, as shown in FIG. 4A, the exposure mask 200 may include a branch portion 231, of which a width decreases as a distance from the respective side of the body portion 220 increases. In other words, the branch portion 231 may be shaped like an outwardly tapered triangle, a base of which is in contact with the respective side of the body portion 220. In still another exemplary embodiment, as shown in FIG. 4B, the exposure mask 200 may include a branch portion 232 having a convex distal end portion. In yet another embodiments, as shown in FIG. 4C, the exposure mask 200 may include a branch portion 233 elongated outwardly from the respective side of the body portion 220, of which edges or sides extend in different directions from the body portion 220. The edges or sides in FIG. 4C may be considered non-linear, while edges or sides in FIG. 4A or FIG. 4B may be considered substantially linear.

The branch portion 230 may be formed of or include a light-blocking material and thus prevent incident light from propagating therethrough. Where the branch portion 230 includes a light-blocking material, the first insulating layer PV1 may be of a negative type. Portions of the mask substrate 210 are exposed by the opening 240, such as at positions between adjacent branch portions 230. Since a fraction of the incident light can propagate between the branch portions 230, optical transmittance of the branch portion 230 may be determined by the width D1, the space D2 and the pitch PT of the branch portion 230. In exemplary embodiments, the branch portion 230 may be configured to allow most of the incident light to propagate thereby.

Figure 5:
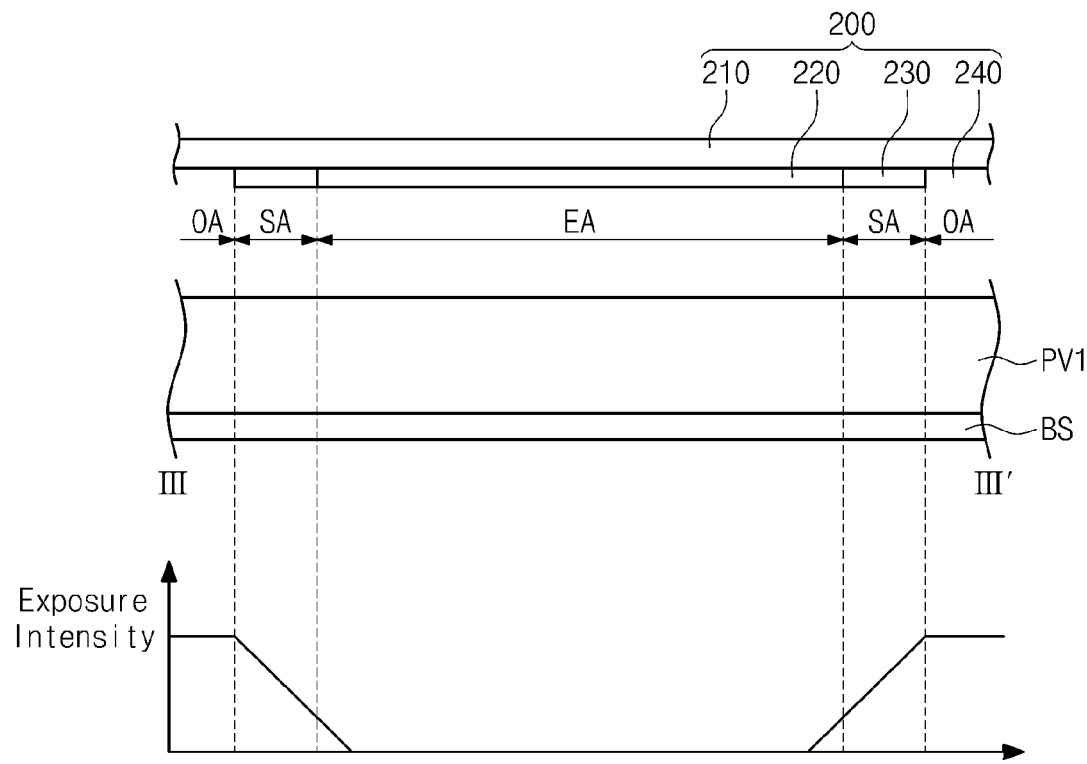
FIG. 5 is a schematic diagram illustrating a cross-sectional view of the exposure mask taken along line III-III' of FIG. 3 with respect to an exposure intensity corresponding to the cross-section of the exposure mask.

FIG. 5 is a schematic diagram illustrating a cross-sectional view of the exposure mask taken along line III-III' of FIG. 3 with respect to an exposure intensity corresponding to the cross-section of the exposure mask. To provide better understanding of exemplary embodiments of the invention, both of the first insulating layer PV1 to be exposed using the exposure mask 200 and an intensity of light to be incident into the first insulating layer PV1 (hereinafter, referred as to a an exposure intensity) are illustrated in FIG. 5. Other layers on the base substrate BS are omitted for convenience of explanation.

Figure 6:
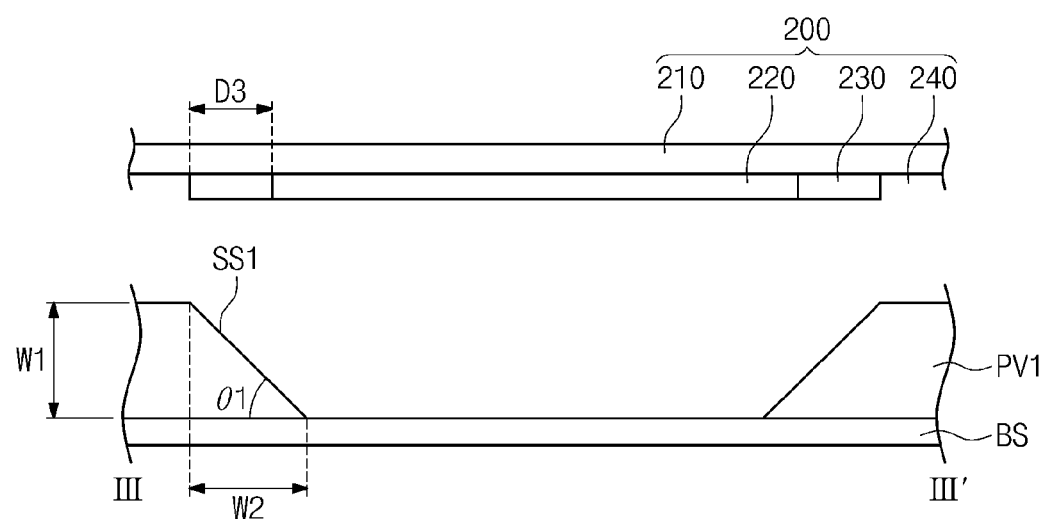
FIG. 6 is a schematic diagram illustrating a cross-sectional view of the exposure mask taken along line III-III' of FIG. 3 with respect to a corresponding portion of a first insulating layer exposed using the exposure mask.

FIG. 6 is a schematic diagram illustrating a cross-sectional view of the exposure mask taken along line III-III' of FIG. 3 with respect to a corresponding portion of a first insulating layer exposed using the exposure mask. To provide better understanding of exemplary embodiments of the invention, the first insulating layer PV1, which may be exposed using the exposure mask 200 and developed, is illustrated in FIG. 6. In the following description of FIGS. 5 and 6, a previously described element may be identified by a similar or identical reference number without repeating an overlapping description thereof, for the sake of brevity. Other layers on the base substrate BS are omitted for convenience of explanation.

Referring to FIG. 5, due to the presence of the branch portion 230, an exposure intensity of a sloped surface region SA may increase linearly from a position adjacent to an exposure region EA to a position adjacent to an opening region OA.

The first insulating layer PV1 on the base substrate BS may be of a negative type and be located below the exposure mask 200.

The exposure region EA may refer to a region of the first insulating layer PV1 corresponding to the body portion 220, while the opening region OA may refer to another region of the first insulating layer PV1 corresponding to the opening 240 of the exposure mask 200. Further, the sloped surface region SA may refer to still another region of the first insulating layer PV1 corresponding to the branch portions 230.

Since the body portion 220 may be formed of or include a light-blocking material, the body portion 220 may prevent most of the incident light from propagating through the exposure mask 200. In other words, the exposure intensity of the exposure region EA may be relatively low.

Since the opening 240 is formed on the opening region OA, the exposure intensity of the opening region OA may be relatively high.

Since the branch portion 230 allows a fraction of the incident light to propagate through the exposure mask 200, the exposure intensity of the sloped surface region SA may be between those of the exposure and opening regions EA and OA. Since the sloped surface region SA is provided adjacent to the opening region OA, a fraction of light incident into the opening region OA may be diffracted to be incident into the sloped surface region SA adjacent thereto. Further, since the exposure region EA is provided adjacent to the sloped surface region SA, a fraction of light incident into the sloped surface region SA may be diffracted to be incident into the exposure region EA adjacent thereto. Accordingly, the exposure intensity of the sloped surface region SA may increase from a position adjacent to the exposure region EA to a position adjacent to the opening region OA.

Referring to FIG. 6, the first insulating layer PV1 may be developed to have the first sloped surface SS1 that is slanted at a first angle θ1 with respect to the base substrate BS. Since a portion of the first insulating layer PV1 in the opening region OA is fully exposed with the incident light, the portion of the first insulating layer PV1 in the opening region OA may not be removed after the developing. Since another portion of the first insulating layer PV1 in the exposure region EA is fully blocked from the incident light, the portion of the first insulating layer PV1 in the exposure region EA may be completely removed after the developing, and thus, a corresponding portion of the base substrate BS thereunder on the exposure region EA may be exposed. Still another portion of the first insulating layer PV1 located in the sloped surface region SA may be exposed with light, of which an intensity increases linearly from a position adjacent to the exposure region EA to another position adjacent to the opening region OA, and thus, after the developing, the portion of the first insulating layer PV1 located in the sloped surface region SA may have a profile corresponding to a spatial distribution of an amount of the exposing light. In one exemplary embodiment, for example, a thickness of the first insulating layer PV1 in the sloped surface region SA may increase in a direction from the position adjacent to the exposure region EA to another position adjacent to the opening region OA.

The first angle θ1 may be changed by adjusting the width and/or length of the branch portion 230. In exemplary embodiments, for example, the larger the length D3 of the branch portion 230, the larger the width W2 of the first sloped surface SS1 projected along the first direction. Where the width W2 increases, the first angle θ1 may decrease. In other words, the first angle θ1 and the slope of the first sloped surface SS1 can be controlled by adjusting the width and/or length of the branch portion 230.

Figure 7:
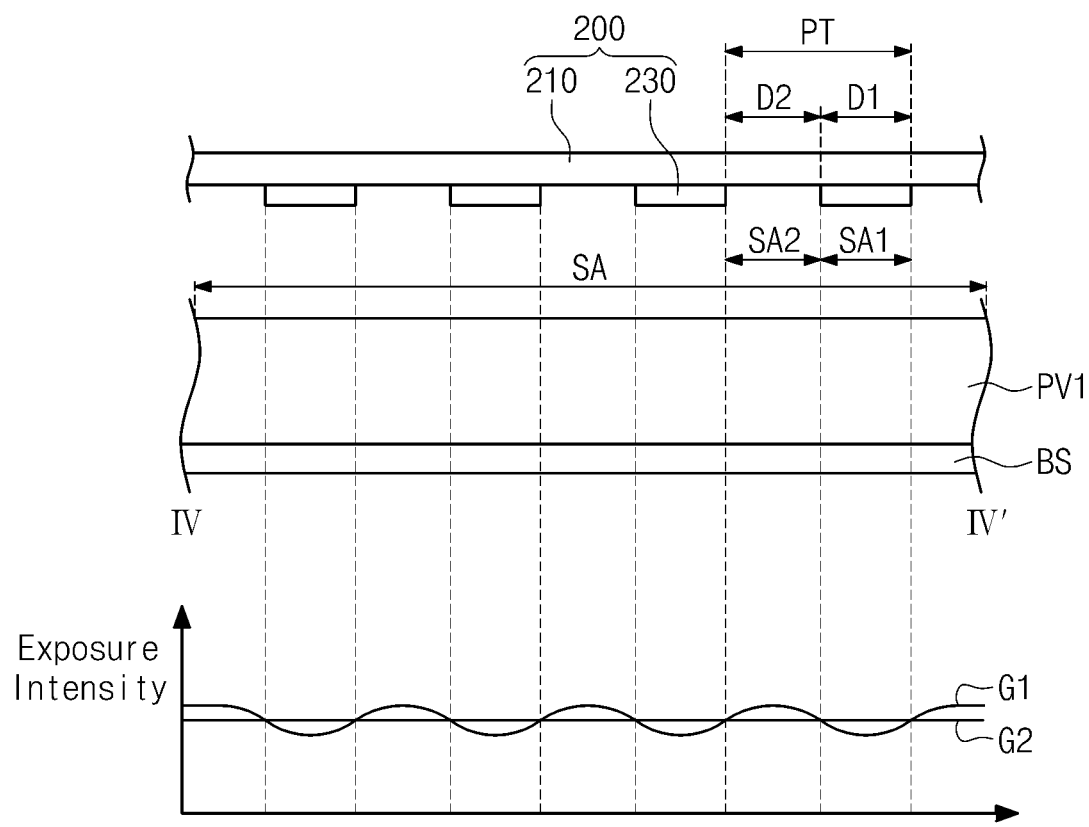
FIG. 7 is a schematic diagram illustrating a cross-sectional view of the exposure mask taken along line IV-IV' of FIG. 3 with respect to an exposure intensity corresponding to the cross-section of the exposure mask.

FIG. 7 is a schematic diagram illustrating a cross-sectional view of the exposure mask taken along line IV-IV' of FIG. 3 with respect to an exposure intensity corresponding to the cross-section of the exposure mask. To provide better understanding of exemplary embodiments of the invention, both of the first insulating layer PV1, which may be exposed using the exposure mask 200, and the exposure intensity on the sloped surface region SA are illustrated in FIG. 7. In the following description of FIG. 7, a previously described element may be identified by a similar or identical reference number without repeating an overlapping description thereof, for the sake of brevity. Other layers on the base substrate BS are omitted for convenience of explanation.

Referring to FIG. 7, the branch portions 230 may have the pitch PT and the width D1 allowing the sloped surface region SA to have a uniform exposure intensity.

The sloped surface region SA may include a first region SA1 and a second region SA2. The first region SA1 may refer to a region of the first insulating layer PV1 corresponding to the branch portion 230, and the second region SA2 may refer to another region of the first insulating layer PV1 corresponding to a region between adjacent branch portions 230. This means that the first region SA1 may have a width determined by the width D1 of the branch portion 230, and that the second region SA2 may have a width determined by the space D2 between the branch portions 230. The sloped surface region SA may collectively include a plurality of first and second regions SA1 and SA2 alternating with each along the respective side of the body portion 220.

Light to be incident into the branch portion 230 may be blocked by the branch portion 230, and thus, the first region SA1 may have a relatively low exposure intensity. In contrast, light may propagate between the branch portions 230 and be incident into the second region SA2, and thus, the second region SA2 may have a relatively high exposure intensity. Accordingly, the sloped surface region SA may have a non-uniform exposure intensity (hereinafter, referred as to a "first exposure intensity G1"), which may result from the arrangement of the separated branch portions 230.

However, where the pitch PT ranges from about 1 μm to about 2.6 μm, the exposure intensity can be uniform in the sloped surface region SA. In exemplary embodiments, for example, a fraction of the light passing through the second region SA2 may be diffracted to be incident into the first region SA1 adjacent thereto. In the first region SA1, the presence of the diffracted fraction of the light may compensate the above-described difference in exposure intensity between the first and second regions SA1 and SA2, and thus, the sloped surface region SA may have a uniform exposure intensity (hereinafter, referred as to a "second exposure intensity G2").

FIGS. 8A through 8D are cross-sectional views illustrating an exemplary embodiment of a process of fabricating a display panel, according to the invention. In the following description of FIGS. 8A through 8D, a previously described element may be identified by a similar or identical reference number without repeating an overlapping description thereof, for the sake of brevity.

Figure 8A:
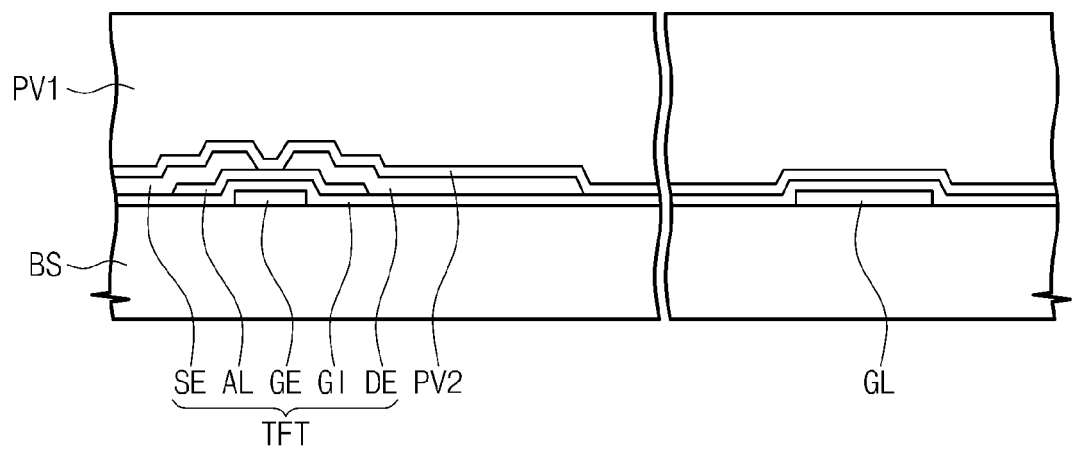
FIGS. 8A through 8D are sectional views illustrating an exemplary embodiment of a process of fabricating a display panel, according to the invention.

As shown in FIG. 8A, the base substrate BS, the thin film transistor TFT, and the first and second insulating layers PV1 and PV2 may be formed (e.g., provided). In one exemplary embodiment, for example, the gate line GL and the thin film transistor TFT may be formed on the base substrate BS, and the first and second insulating layers PV1 and PV2 may be sequentially formed to cover the gate line GL and the thin film transistor TFT.

Figure 8B:
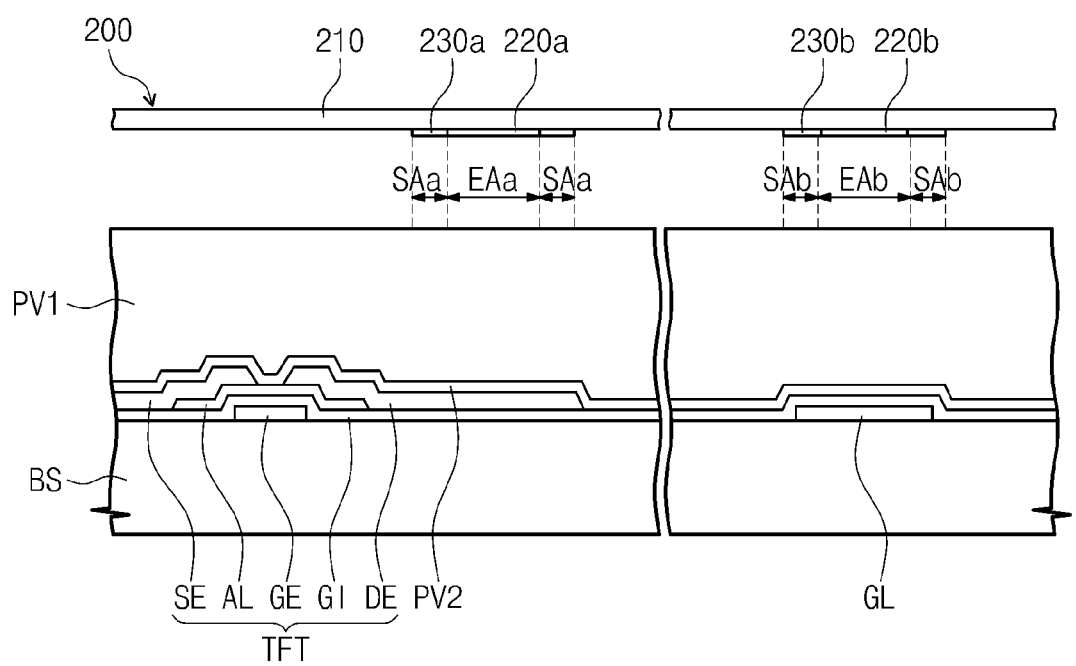

As shown in FIG. 8B, an exposure process using the exposure mask 200 may be performed. In one exemplary embodiment, for example, the exposure mask 200 may be aligned on the first insulating layer PV1, and the first insulating layer PV1 may be exposed by light passing through the exposure mask 200.

The exposure mask 200 may include first body and branch portions 220a and 230a and second body and branch portions 220b and 230b. As the result of the exposure process, exposure regions of the first insulating layer PV1 may have shapes and positions that are determined by shapes and positions of the body and branch portions 220a, 230a, 220b and 230b. In one exemplary embodiment, for example, owing to the presence of the first and second body portions 220a and 220b, first and second exposure regions EAa and EAb of the first insulating layer PV1 may be fully blocked from an exposure light. In contrast, owing to the presence of the first and second branch portions 230a and 230b, the first and second sloped surface regions SAa and SAb of the first insulating layer PV1 may be partially exposed by the exposure light, of which an intensity or amount increases as a distance away from the first and second exposure regions EAa and EAb increases.

Figure 8C:
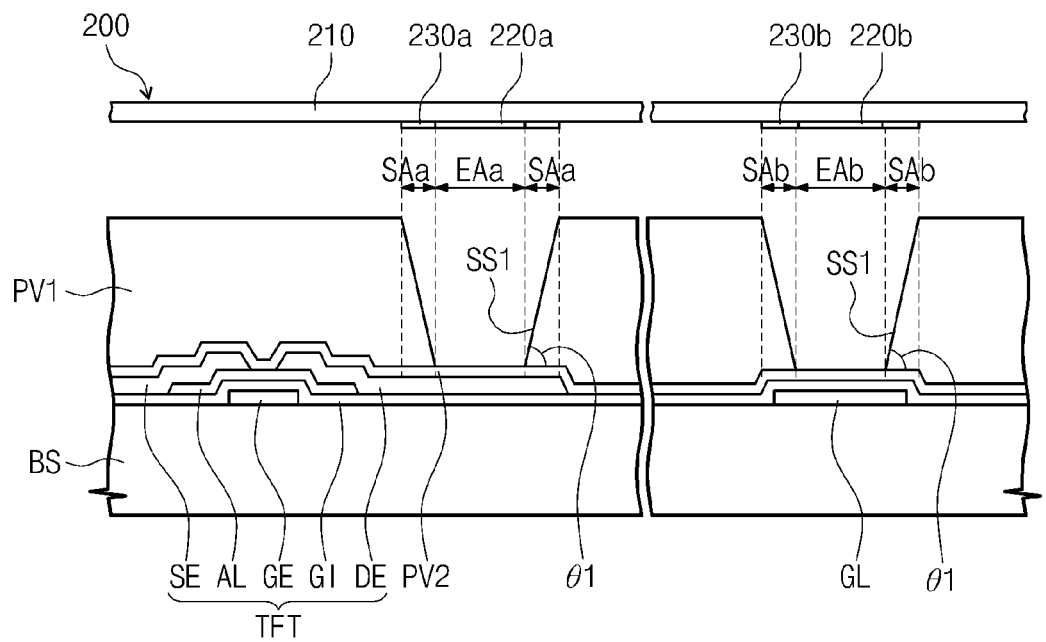

As shown in FIG. 8C, the first insulating layer PV1 may be developed by, for example, a developer.

In exemplary embodiments, the first insulating layer PV1 may be of a negative type. Where the first insulating layer PV1 is a negative type, the first and second exposure regions EAa and EAb of the first insulating layer PV1 may be fully removed to expose the second insulating layer PV2, because the first and second exposure regions EAa and EAb may be fully blocked from the exposure light. In contrast, removal amounts of the first and second sloped surface regions SAa and SAb of the insulating layer PV1 may be determined by the amounts of the exposing light that is incident thereto. Since the first and second sloped surface regions SAa and SAb are exposed by the exposure light, of which an intensity or amount increases as a distance away from the first and second exposure regions EAa and EAb increases, the first insulating layer PV1 may have the first sloped surfaces SS1, which is slanted at the first angle θ1 with respect to the base substrate BS, in the first and second sloped surface regions SAa and SAb.

Figure 8D:
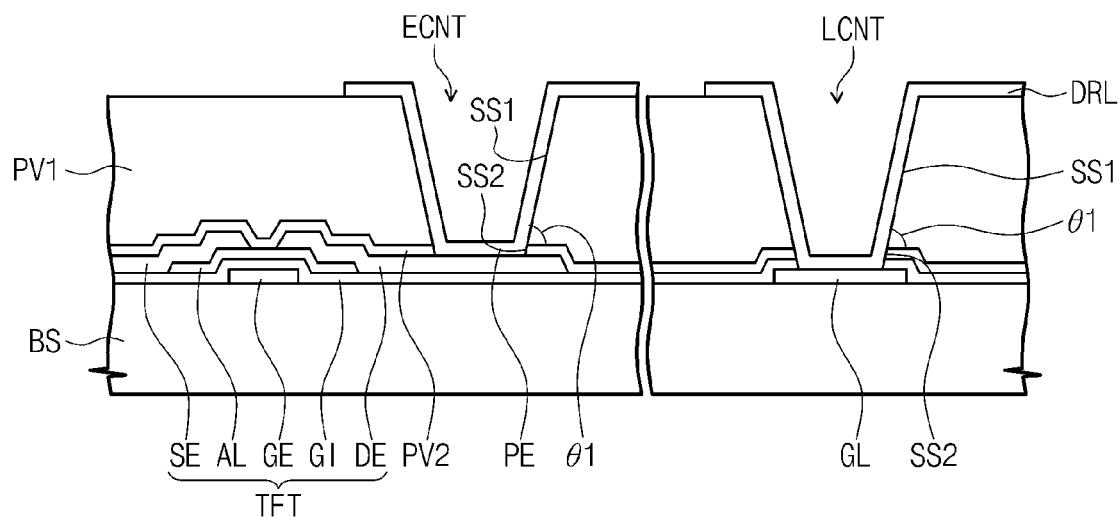

As shown in FIG. 8D, the second insulating layer PV2 and the gate insulating layer GI may be etched to form the contact holes. In one exemplary embodiment, for example, the contact holes may be formed to expose the drain electrode DE and the gate line GL. In exemplary embodiments, the contact holes may include the electrode contact hole ECNT exposing the drain electrode DE and the line contact hole LCNT exposing the gate line GL.

The etching of the second insulating layer PV2 may be performed using a dry etching process. Where the first angle θ1 is relatively large or the slope of the first sloped surface SS1 is relatively large, an undercut may be formed near the second sloped surface SS2 after the dry etching process. However, where the first angle θ1 is relatively small or the slope of the first sloped surface SS1 is relatively small, suppression of the undercut from being formed near the second sloped surface SS2 after the dry etching process may be provided.

Thereafter, the pixel electrode PE and a pad electrode DRL may be formed on the first insulating layer PV1. In exemplary embodiments, the pixel and pad electrodes PE and DRL may be connected to the drain electrode DE and the gate line GL, respectively.

In one exemplary embodiment, for example, the pixel electrode PE may be electrically connected to the drain electrode DE through the electrode contact hole ECNT. Further, the pixel electrode PE may be formed to cover a portion of the top surface of the first insulating layer PV1, the first and second sloped surfaces SS1 and SS2, and an exposed portion of the drain electrode DE, which is at or adjacent to the electrode contact hole ECNT. The pad electrode DRL may be electrically connected to the gate line GL via the line contact hole LCNT. Further, the pad electrode DRL may be formed to cover a portion of the top surface of the first insulating layer PV1, the first and second sloped surfaces SS1 and SS2, and an exposed portion of the gate line GL, which is at or adjacent to the contact hole LCNT. Since formation of the undercut near the first and second sloped surface SS1 and SS2 can be reduced or effectively prevented, contact failure between layers connected by the contact holes ECNT and LCNT may be reduced or effectively prevented. Accordingly, defect in or failure of a pixel and/or a display panel may be reduced or effectively prevented. As a result, the display panel can be fabricated with improved yield.

The invention may not be limited to the above described exemplary, in which the first insulating layer PV1 is of the negative type. The first insulating layer PV1 may be of the positive type. Where the first insulating layer PV1 of the positive type, the body portion 220 and the branch portion 230 may be configured to allow the exposing light to propagate therethrough, while the light-blocking material may be provided on other region, except for the body and branch portions 220 and 230.

According to one or more exemplary embodiment of the invention, the exposure mask may be configured to adjust an amount of exposing light used in forming contact hole in the first insulating layer, and thus controlling the slope of the sloped surface of the first insulating layer is provided. Accordingly, a contact failure occurring between layers vertically connected through the contact hole may be reduced or effectively prevented. As a result, a defect in or failure of a pixel and/or a display panel may be reduced or effectively prevented.

While exemplary embodiments of the invention have been particularly shown and described, it will be understood by one of ordinary skill in the art that variations in form and detail may be made therein without departing from the spirit and scope of the invention as represented in the attached claims.

What is claimed is:

1. An exposure mask for forming a pattern in a photosensitive material, comprising:
   a mask substrate which is disposed facing the photosensitive material;
   a body portion on the mask substrate and corresponding to a shape of the pattern at a distance furthest from the exposure mask, the body portion defining a polygon shape comprising a plurality of sides which defines an entirety of an outer edge of the body portion, in a plan view; and
   a plurality of branch portions on the mask substrate, each extending outward directly from the outer edge of the body portion, in the plan view, wherein
the pattern comprises a contact hole of a display device,
among the plurality of branch portions extending directly from the outer edge of the body portion, a branch portion extends from each side of the body portion, and
for an entirety of the outer edge of the body portion, each pair of directly adjacent branch portions is spaced apart from each other.

2. The exposure mask of claim 1, wherein
the branch portion extended from each side of the body portion extends perpendicular to the side from which it extends, in the plan view.

3. The exposure mask of claim 1, wherein the adjacent branch portions are spaced apart from each other at a pitch from about 1 micrometer to about 2.6 micrometers.

4. The exposure mask of claim 3, wherein a width of each branch portion is from about 30% to about 60% of the pitch.

5. The exposure mask of claim 1, wherein each branch portion is elongated from the outer edge of the body portion, and has a length from about 1 micrometer to about 5 micrometers.

6. The exposure mask of claim 1, wherein a width of each branch portion decreases as a distance from the body portion increases, in the plan view.

7. The exposure mask of claim 1, wherein the photosensitive material is a negative photosensitive material.

8. The exposure mask of claim 7, wherein the body portion and the plurality of branch portions comprise a light-blocking material.

9. The exposure mask of claim 1, wherein an underlying structure of the display device comprises:
first insulating layer comprising the photosensitive material in which the pattern is formed;
a metal layer under the first insulating layer; and
a second insulating layer between the first insulating layer and the metal layer,
wherein the contact hole exposes the metal layer through the second insulating layer.

10. The exposure mask of claim 9, wherein
the first insulating layer further comprises an organic insulating material, and
the second insulating layer further comprises an inorganic insulating material.

11. A method of fabricating a display panel, comprising:
providing a base substrate;
providing a metal layer on the base substrate;
providing a first insulating layer comprising a layer of photosensitive material, on the metal layer;
disposing an exposure mask facing the first insulating layer comprising the layer of the photosensitive material, and exposing the first insulating layer using the exposure mask;
developing the exposed first insulating layer comprising the layer of the photosensitive material to form a contact hole therein exposing a portion of the metal layer; and
forming a transparent conductive layer on the exposed and developed first insulating layer comprising the layer of the photosensitive material in which the contact hole is defined, and electrically connected to the exposed portion of the metal layer via the contact hole,
wherein the exposure mask comprises:
a mask substrate;
a body portion on the mask substrate, the body portion defined by outer edges thereof which correspond to a shape of the contact hole defined in the layer of the photosensitive material at a distance furthest from the exposure mask; and
a plurality of branch portions on the mask substrate and each directly extending outward from an outer edge of the body portion to be spaced apart from each other in a direction extended along the outer edge of the body portion, in a plan view,
wherein at each outer edge among the outer edges of the body portion,
a portion of the layer of photosensitive material in which the contact hole is defined extends to overlap the branch portions spaced apart from each other in the direction extended along the outer edge of the body portion, and
in the exposing the first insulating layer, the portion of the layer of photosensitive material is provided with a uniform exposure in the direction extended along the outer edge of the body portion, by the plurality of branch portions spaced apart from each other.

12. The method of claim 11, wherein
the body portion has a polygonal shape comprising a plurality of sides, in the plan view,
a branch portion among the plurality of branch portions extends from each side of the body portion, and
the branch portion extends perpendicular to the side from which it extends, in the plan view.

13. The method of claim 11, wherein adjacent branch portions are spaced apart from each other at a pitch from about 1 micrometer to about 2.6 micrometers.

14. The method of claim 13, wherein a width of the branch portion is from about 30% to about 60% of the pitch.

15. The method of claim 14, wherein each branch portion is elongated from the outer edge of the body portion, and has a length from about 1 micrometer to about 5 micrometers.

16. The method of claim 11, wherein a width of each branch portion decreases as a distance from the body portion increases.

17. The method of claim 11, wherein the first insulating layer comprises a negative photosensitive material.

18. The method of claim 11, wherein the body portion and the plurality of branch portions comprise a light-blocking material.

19. The method of claim 11, further comprising:
providing a second insulating layer between the first insulating layer and the metal layer; and
removing a portion of the second insulating layer to form the contact hole exposing the portion of the metal layer.

20. An exposure mask for forming a pattern in a photosensitive material, comprising:
a mask substrate which is disposed facing a layer of the photosensitive material;
a body portion on the mask substrate, the body portion defined by outer edges thereof which correspond to a shape of the pattern at a distance furthest from the exposure mask; and
a plurality of branch portions on the mask substrate and each directly extending outward from an outer edge of the body portion to be spaced apart from each other in a direction extended along the outer edge of the body portion, in a plan view,
wherein
the pattern comprises a contact hole of a display device which exposes an underlying metal layer thereof and is defined by the layer of the photosensitive material, and
at each outer edge among the outer edges of the body portion, a portion of the layer of photosensitive material in which the contact hole is defined extends to overlap the branch portions spaced apart from each other in the direction extended along the outer edge of the body portion, and the branch portions spaced apart from each other and to which a light is exposed provides the portion of the layer of photosensitive material with a uniform exposure in the direction extended along the outer edge of the body portion.

* * * * *